United States Patent
Refai-Ahmed et al.

(10) Patent No.: US 11,373,929 B1
(45) Date of Patent: Jun. 28, 2022

(54) THERMAL HEAT SPREADER PLATE FOR ELECTRONIC DEVICE

(71) Applicant: XILINX, INC., San Jose, CA (US)

(72) Inventors: Gamal Refai-Ahmed, Santa Clara, CA (US); Chi-Yi Chao, New Taipei (TW); Suresh Ramalingam, Fremont, CA (US); Hoa Lap Do, San Jose, CA (US); Anthony Torza, Oakland, CA (US); Brian Philofsky, Longmont, CO (US); Arun Kumar Varadarajan Rajagopal, San Jose, CA (US)

(73) Assignee: XILINX, INC., San Jose, CA (US)

( * ) Notice: Subject to any disclaimer, the term of this patent is extended or adjusted under 35 U.S.C. 154(b) by 167 days.

(21) Appl. No.: 16/780,305

(22) Filed: Feb. 3, 2020

(51) Int. Cl.
| | |
|---|---|
| *H01L 23/473* | (2006.01) |
| *H01L 23/467* | (2006.01) |
| *H01L 23/538* | (2006.01) |
| *H01L 25/10* | (2006.01) |
| *H01L 23/00* | (2006.01) |
| *H01L 23/427* | (2006.01) |

(52) U.S. Cl.
CPC .......... *H01L 23/473* (2013.01); *H01L 23/467* (2013.01); *H01L 23/5385* (2013.01); *H01L 24/32* (2013.01); *H01L 25/105* (2013.01); *H01L 23/427* (2013.01); *H01L 24/16* (2013.01); *H01L 24/73* (2013.01); *H01L 2224/16225* (2013.01); *H01L 2224/32245* (2013.01); *H01L 2224/73253* (2013.01)

(58) Field of Classification Search
CPC ................................................ H01L 23/473
USPC ........................................................ 257/713
See application file for complete search history.

(56) References Cited

U.S. PATENT DOCUMENTS

| | | | |
|---|---|---|---|
| 6,011,304 A | 1/2000 | Mertol | |
| 6,650,538 B1 | 11/2003 | Chu et al. | |
| 7,449,775 B1 | 11/2008 | Ankireddi | |
| 9,812,374 B1 | 11/2017 | Refai-Ahmed et al. | |
| 10,043,730 B2 | 8/2018 | Refai-Ahmed et al. | |
| 2002/0146540 A1* | 10/2002 | Johnston | F28D 5/00 428/167 |
| 2002/0184894 A1* | 12/2002 | Batchelor | F28F 3/02 62/3.3 |
| 2003/0067746 A1* | 4/2003 | Ishimine | H01L 23/373 361/690 |
| 2004/0076408 A1 | 4/2004 | Kenny et al. | |
| 2004/0099944 A1 | 5/2004 | Kimura | |
| 2006/0060637 A1 | 3/2006 | Susheel et al. | |

(Continued)

OTHER PUBLICATIONS

Shi, Bing, et al. "Hybrid 3D-IC Cooling System Using Micro-Fluidic Cooling and Thermal TSV's" Proc. of the 2012 IEEE Computer Society Annual Symposium on VLSI, Aug. 19, 2012, pp. 33-38, IEEE, Piscataway, New Jersey, USA.

*Primary Examiner* — Ajay Arora

(74) *Attorney, Agent, or Firm* — Patterson + Sheridan, LLP

(57) ABSTRACT

A cooling plate assembly and electronic device having the same are provided which utilize active and passive cooling devices for improved thermal management of one or more chip package assemblies included in the electronic device. In one example, a cooling plate assembly is provided that includes a cooling plate having a first surface and an opposing second surface, a first active cooling device coupled to the first surface of the cooling plate, and a first passive cooling device coupled to the second surface of the cooling plate.

20 Claims, 6 Drawing Sheets

(56) References Cited

U.S. PATENT DOCUMENTS

| | | | |
|---|---|---|---|
| 2006/0067045 A1* | 3/2006 | Ali | F28D 15/0275 |
| | | | 361/679.47 |
| 2009/0039499 A1 | 2/2009 | Chainer | |
| 2010/0177477 A1 | 7/2010 | Cheng et al. | |
| 2010/0208432 A1* | 8/2010 | Bhagwagar | H01L 23/3735 |
| | | | 361/717 |
| 2014/0151871 A1 | 6/2014 | Refai-Ahmed | |
| 2016/0019937 A1 | 1/2016 | Arora et al. | |
| 2017/0009261 A9 | 1/2017 | Larsen | |

* cited by examiner

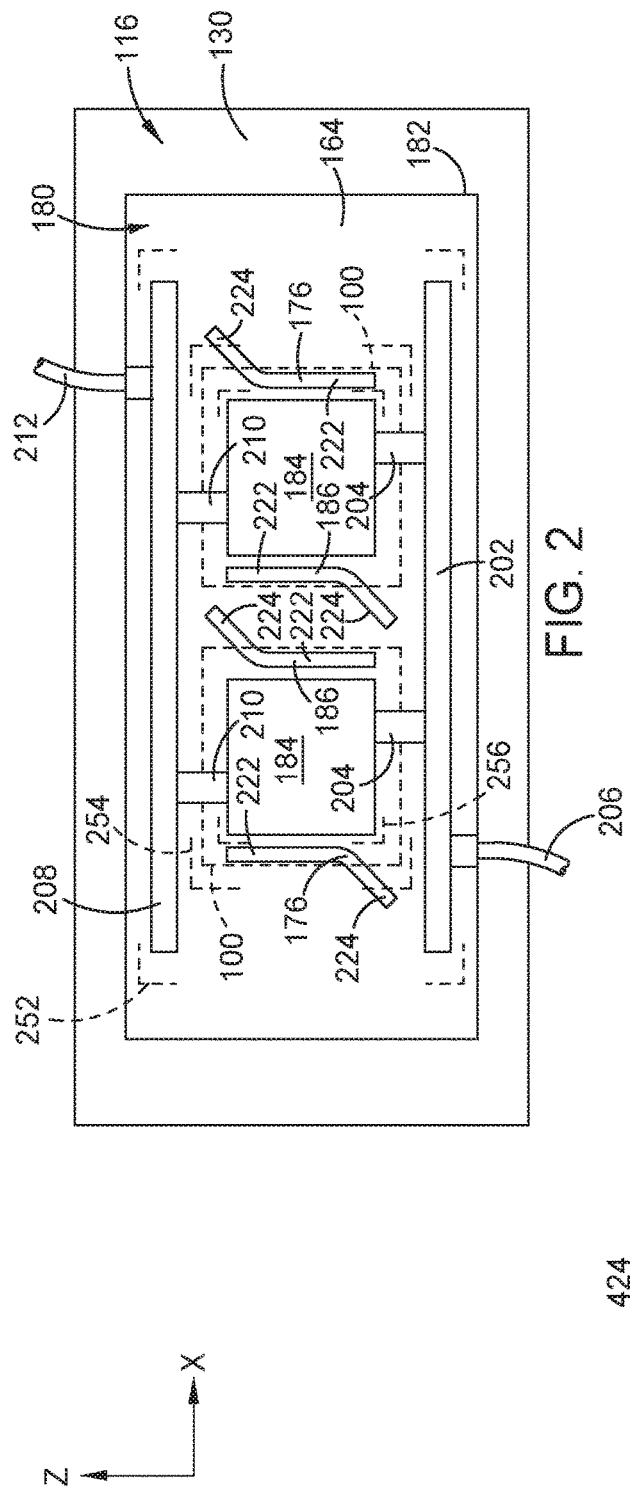
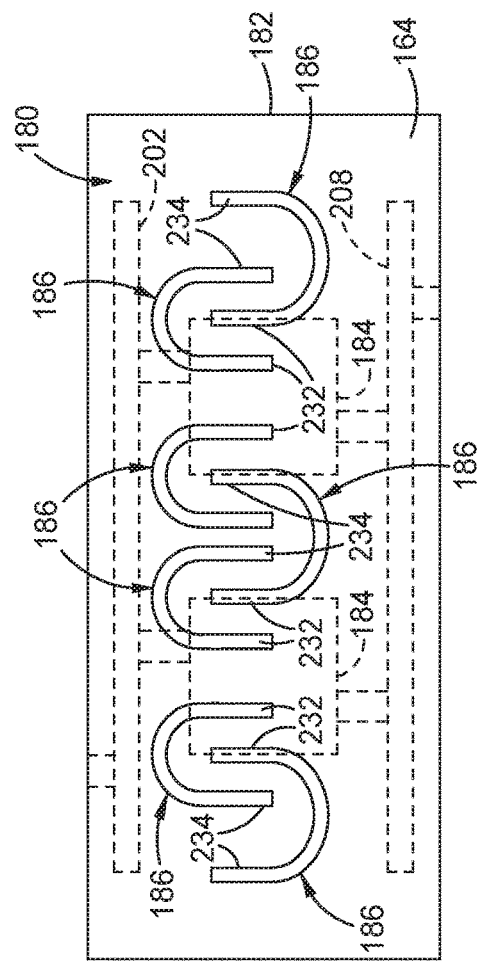
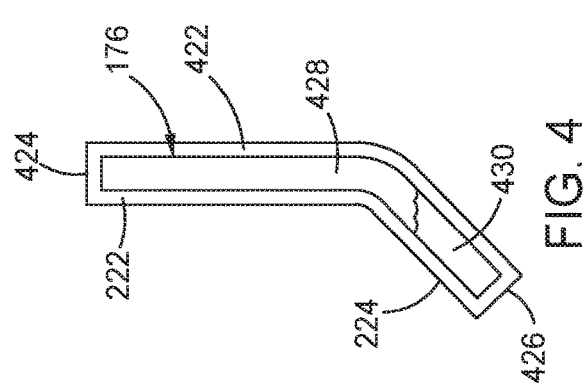

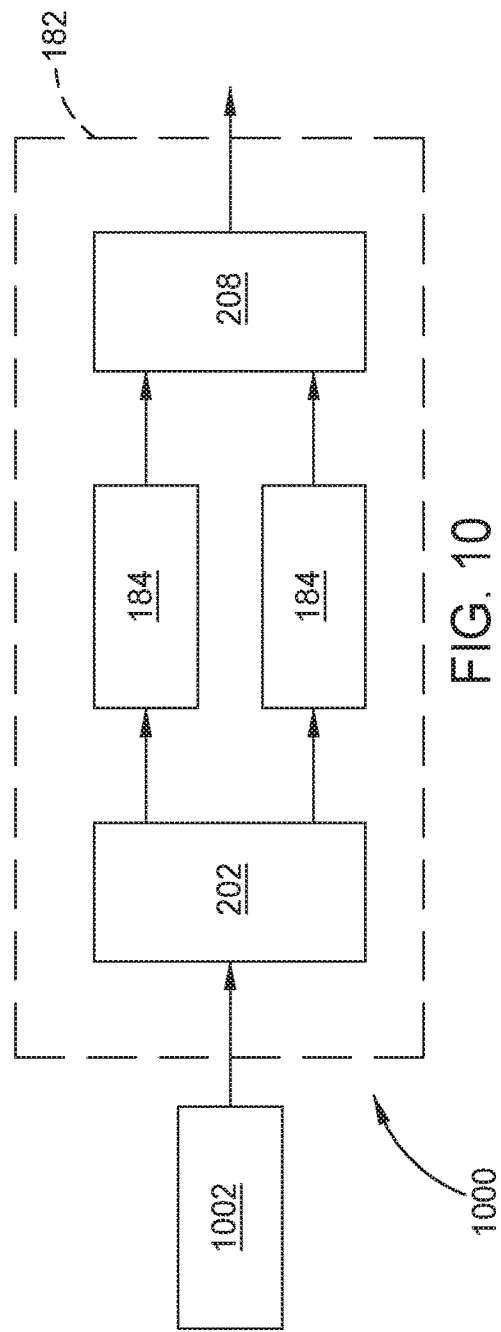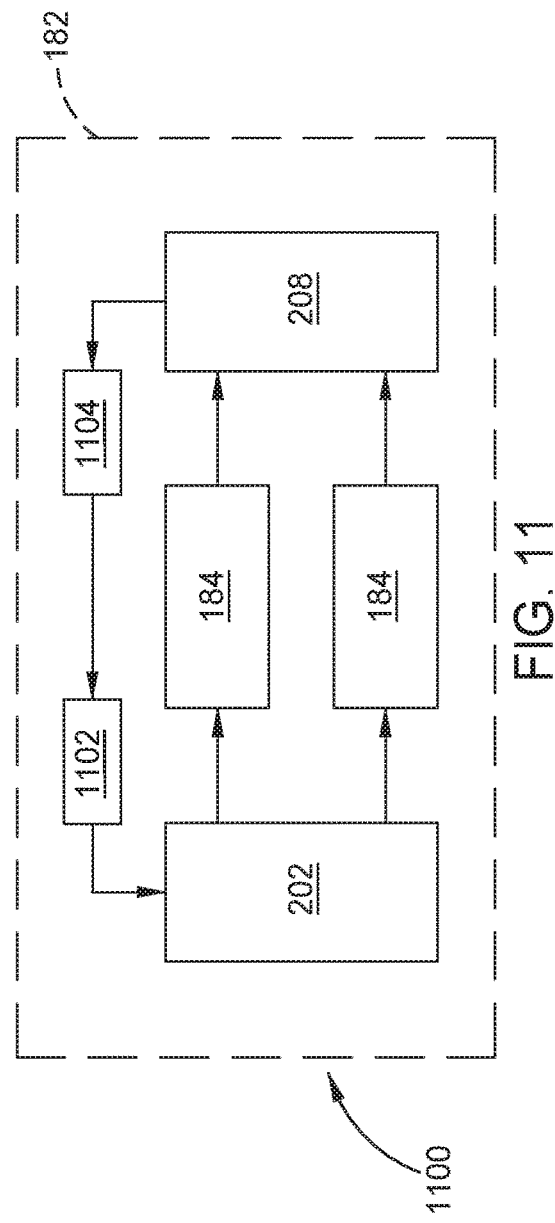

THERMAL HEAT SPREADER PLATE FOR ELECTRONIC DEVICE

TECHNICAL FIELD

Embodiments of the present invention generally relate to a thermal heat spreader plate and electronic devices having the same, and more particularly, to a thermal heat spreader plate having both active and passive cooling devices.

BACKGROUND

Electronic devices often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices. These electronic devices containing one or more chip packages are frequently utilized in advanced electronic computing systems, such as found in telecomm and datacomm equipment, data centers and automotive electronics, among others.

In many chip package assemblies, providing adequate thermal management has become increasingly challenging. Failure to provide adequate cooling often results in diminished service life and even device failure. Thermal management is particularly problematic in applications in air cooling is not sufficient to maintain safe operational temperatures. In such applications, liquid cooling is utilized to control the temperature of the IC dies. However, liquid cooling has many challenges, including potential catastrophic loss of cooling capacity due to coolant leakage or flow issues. Particularly, coolant leakage could lead to catastrophic shorting of the electronic device, rendering the device inoperable, and resulting in a loss of mission critical functionality of the electronic device.

Therefore, a need exists for an electronic device having improved thermal management.

SUMMARY

A cooling plate assembly and electronic device having the same are provided which utilize active and passive cooling devices for improved thermal management of one or more chip package assemblies included in the electronic device. In one example, a cooling plate assembly is provided that includes a cooling plate having a first surface and an opposing second surface, a first active cooling device coupled to the first surface of the cooling plate, and a first passive cooling device coupled to the second surface of the cooling plate.

In another example, an electronic device is provided. The electronic device includes a printed circuit board (PCB), a first chip package assembly, a cooling plate, a first active cooling device, and a first passive cooling device. The first chip package assembly is mounted to the PCB. The cooling plate sandwiches the first chip package assembly against the PCB. The cooling plate has a first surface facing away from the PCB and a second surface facing the PCB. The first active cooling device is coupled to the first surface of the cooling plate. The first passive cooling device coupled to the second surface of the cooling plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a schematic top view of an electronic device having a cooling plate assembly interfaced with a plurality of chip package assemblies illustrating an exemplary geometric arrangement of active and passive cooling devices disposed on a top surface of the cooling plate assembly.

FIG. 3 is a schematic bottom view of the cooling plate assembly of FIG. 2 illustrating an exemplary geometric arrangement of passive cooling devices disposed on a bottom surface of the cooling plate assembly that interfaces with the chip package assemblies.

FIG. 4 is a sectional view of one example of a passive cooling device that is part of the cooling plate assembly of FIG. 2.

FIGS. 10-11 are schematic flow diagrams of various alternative examples of fluid circuits that may be utilized with the active cooling device of the cooling plate assembly of FIG. 1, among others.

Figure 1:
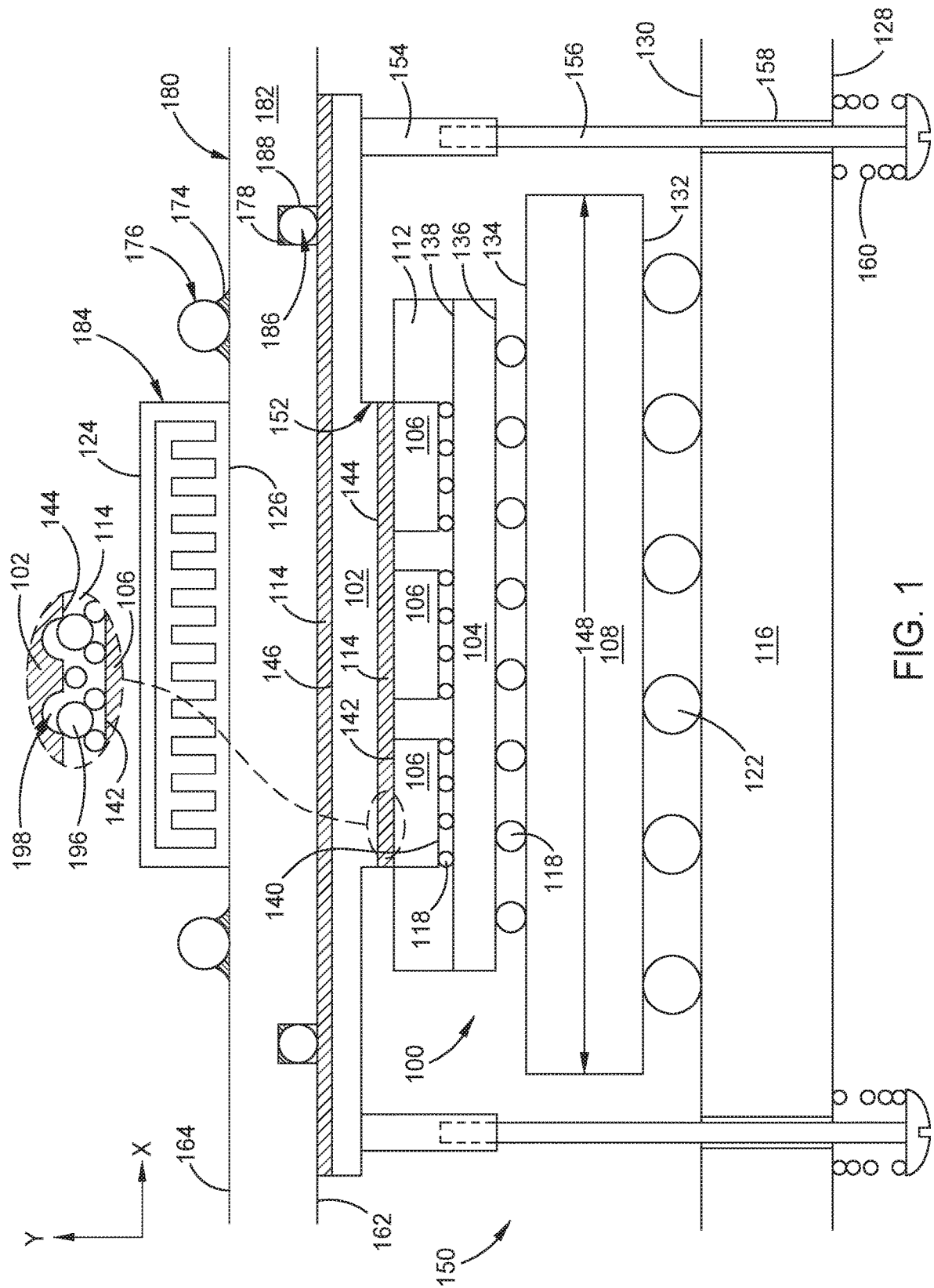
FIG. 1 is a partial schematic sectional view of an electronic device having a chip package assembly interfaced with a cooling plate assembly.

To facilitate understanding, identical reference numerals have been used, where possible, to designate identical elements that are common to the figures. It is contemplated that elements of one embodiment may be beneficially incorporated in other embodiments. Additionally, the adjectives top and bottom are provided for ease of explanation, and may be utilized to desired surfaces that alternatively may have a vertical orientation.

DETAILED DESCRIPTION

A cooling plate assembly is disclosed herein which functions as a thermal heat spreader plate for electronic devices. The cooling plate assembly utilizes active and passive cooling devices for improved thermal management of electronic devices. The cooling plate assembly includes one or more active cooling devices integrated with a cooling plate. The active cooling devices are disposed on a side of the cooling plate that faces away from one the one or more the chip packages of the electronic device. In this manner, the cooling plate shields the sensitive electronics of the chip package assemblies from coolant if inadvertently leaked. As the cooling plate provides a solid physical barrier between the active cooling devices and the chip packages of the electronic device, the cooling plate provides robust protection of the electronic circuitry of the chip package assemblies from catastrophic failure in the event of coolant leaks from the active cooling devices. As the cooling plate assembly is much larger than a chip package and larger than the printed circuit broad to which the chip package is mounted, the cooling plate not only provides robust shielding from potential coolant leaks, but the large area and thermal mass of the cooling plate assembly relative to the area and mass of the chip package assemblies results in an extremely efficient heat sink that efficiently moves (i.e., spreads) heat away from hot regions over the chip package assemblies to regions of the cooling plate assembly that are better suited for effectively transferring heat away from the chip package assemblies.

The thermal management of the cooling plate assembly may optionally be enhanced by one or more of the following features. The cooling plate assembly may include passive cooling devices on both sides of the cooling plate to more efficiently route heat away from hot regions to regions closer to the active cooling devices. The cooling plate assembly may also include an inlet manifold that feeds the one or more active cooling devices that is configured to reduce the amount of particles in the working fluid (i.e., coolant), thereby keeping the active cooling devices free from clogging or having other flow disparities that would reduce the effectiveness of the active cooling device. The cooling plate and/or other plates comprising the heat transfer path away from the chip packages may include patterned surfaces, such as micro-channels, and/or thermal interface material that includes thermally conductive particles to reduce thermal contact resistance and reduce mechanical stress, while establishing a robust heat transfer path for efficient thermal management of the chip package assemblies. Advantageously, the enhanced heat transfer out of the chip package assembly improves reliability and performance of the electronic device, while risk of catastrophic failure due to coolant leakage is substantially eliminated.

As utilized herein, an active cooling device is a heat transfer structure or system that utilizing an open or circulated fluid circuit for transfer heat, examples of which include heat exchangers and fan forced air systems. Active cooling devices may also incorporate passive cooling elements such as a passive fluid element (i.e., a heat pipe) with active air cooling (i.e., fan driven air) and/or active liquid cooling (i.e., a heat exchanger interfaced with the passive cooling elements). In contrast, a passive cooling device is fluidless or has fluid trapped in a sealed volume for heat transfer, examples of which include heat sinks and heat pipes. Passive cooling device may also include passive fluid (i.e., fluid that is not mechanically, electrically or otherwise driven) disposed around heat sinks and heat pipes, thus allowing bouncy natural capillary force or convection to be the dominating flow movement of the passive fluid.

Turning now to FIG. 1, a schematic partial sectional view of an electronic device 150 having a cooling plate assembly 180 interfaced with at least one chip package assembly 100. The cooling plate assembly 180 functions as the primary global-level heat spreader plate of the electronic device 150. A heat spreader 102 may optionally be disposed between the cooling plate assembly 180 and the chip package assembly 100. The heat spreader 102 functions as a local-level heat spreader relative to the function of the cooling plate assembly 180. The at least one chip package assembly 100 is mounted to a printed circuit board 116. Although only one chip package assembly 100 is shown mounted to the printed circuit board 116 in FIG. 1, more than one chip package assembly 100 may be mounted to the printed circuit board 116. For example, up to as many chip package assemblies 100 as can fit on the printed circuit board 116 may be utilized. Additionally, although only one printed circuit board (PCB) 116 is shown interfaced with a single cooling plate assembly 180 in FIG. 1, more than one printed circuit board 116 may be interfaced with the cooling plate assembly 180. For example, up to as many printed circuit boards 116 as available area allows to interface the with the cooling plate assembly 180 may be utilized.

The illustrative chip package assembly 100 also includes one or more integrated circuit (IC) dies 106, an interposer 104 and a package substrate 108. In the example illustrated in FIG. 1, the one or more integrated circuit dies 106 are mounted to the interposer 104, while the interposer 104 is mounted to the package substrate 108. The package substrate 108 of the chip package assembly 100 is mounted to the PCB 116. Optionally, the one or more integrated circuit dies 106 may be directly mounted to the package substrate 108 without use of an interposer.

Although three IC dies 106 are shown in FIG. 1, the total number of IC dies may range from one to as many as can be fit within the chip package assembly 100. Examples of IC dies 106 that may be utilized in the chip package assembly 100 include, but are not limited to, logic and memory devices, such as field programmable gate arrays (FPGA), application-specific integrated circuits (ASICs), memory devices, such as high band-width memory (HBM), optical devices, processors or other IC logic or memory structures. One or more of the IC dies 106 may optionally include optical devices such as photo-detectors, lasers, optical sources, and the like.

Each IC die 106 includes a bottom surface 140 disposed opposite a top surface 142. The bottom and top surfaces 140, 142 do not necessarily represent the active and substrate sides of the dies 106. Although not shown, one or more IC dies 106 may be stacked on top of each other, with the bottom most die 106 being mounted to the interposer 104 (or substrate 108). In one example of a die stack disposed on the interposer 104 (or substrate 108), the bottom surface 140 of one IC die 106 mounted to the top surface 142 of a second IC die 106 may result in the active sides of each die 106 facing the same direction, or facing opposite directions. For example, the active side of one IC die 106 may be directly mounted to the active side of the adjacent die 106.

Dielectric filler 112 is disposed on the interposer 104 and at least partially laterally circumscribes the dies 106. The dielectric filler 112 may also encapsulate the dies 106 against the interposer 104. The dielectric filler 112 provides additional rigidity to the chip package assembly 100, while also protecting the solder connections 118 between the IC dies 106. The dielectric filler 112 may be an epoxy-based material or other suitable material. The dielectric filler 112 may additionally include fillers, for example, inorganic fillers such as silica ($SiO_2$).

In one example, the dielectric filler 112, prior to curing, has a viscosity suitable to flow into and fill the interstitial space between the bottom surface 140 of the dies 106 and the top surface 138 of the interposer 104 around the solder connections 118. Alternatively, a separate underfill material may be used to fill the interstitial space the bottom surface 140 of the dies 106 and the top surface 138 of the interposer 104 around the solder connections 118, while the dielectric filler 112 is disposed over the underfill and fills the interstitial space between adjacent dies 106.

Functional circuitry of the IC dies 106 is connected to the circuitry of the interposer 104 through the solder connections 118 or other suitable electrical connection, such as a hybrid connecter comprised of metal circuit connection material disposed in a dielectric sheet. The circuitry of the interposer 104 is similarly connected to the circuitry of the package substrate 108. In the example depicted in FIG. 1, a bottom surface 136 of the interposer 104 is electrically and mechanically coupled to a top surface 134 of the package substrate 108 by solder connections 118 or other suitable electrical connection, such as a hybrid connecter comprised of metal circuit connection material disposed in a dielectric sheet. Additionally, the circuitry of the package substrate 108 is coupled to the circuitry of the PCB 116 via solder balls 122 when the chip package assembly 100 is mounted to the PCB 116 to form the electronic device 150.

The top surface 142 of the upper most die 106 faces a bottom surface 144 of the heat spreader 102. The heat spreader 102 is fabricated from rigid thermally conductive material. Materials suitable for fabricating the heat spreader 102 include stainless steel, copper, nickel-plated copper and aluminum, among other suitable thermally conductive materials. The heat spreader 102 enhances local-level heat transfer to the cooling plate assembly 180.

Thermal interface material (TIM) 114 may be disposed between the top surface 142 of the IC die 106 and the bottom surface 144 of the heat spreader 102 to enhance heat transfer therebetween. In one example, the TIM 114 may be a thermally conductive grease, thermal gel or thermal epoxy, such as, packaging component attach adhesives. Optionally, the TIM 114 may a plurality of thermally conductive particles 196 dispersed in a carrier material. The carrier material may be comprised of the thermally conductive grease, thermal gel or thermal epoxy. The thermally conductive particles 196 may include one or more of metal, carbon or other highly thermally conductive particles, metal fibers, metal powder, metal balls, fillers or additives that enhance the heat transfer of the carrier material of the TIM 114.

Optionally, the bottom surface 144 of the heat spreader 102 may include a patterned surface 198. The patterned surface 198 may be comprised of dimples, projections, blind holes, slots, channels and the like which increase the surface area of the bottom surface 144 in contact with the TIM 114, which increases the heat transfer efficiency. The patterned surface 198, in one example, is comprised of a pattern of micro-channels formed in the bottom surface 144 of the heat spreader 102. The patterned surface 198 may be formed in the bottom surface 144 via etching, embossing, or any other suitable technique. For some examples, the patterned surface 198 may be in the form of micro-channels arranged rows, in columns, as positive-sloping diagonals, as negative-sloping diagonals, or as a combination thereof. In one example, the features (i.e., micro-channels, protrusions, etc.) forming the patterned surface 198 may have a plus or minus elevation of, but not limited to, 0.1 mm to 0.2 mm relative to the general plane of the bottom surface 144.

The thermally conductive particles 196, when utilized, may be up to and even greater than 90% of the TIM 114 by weight. The thermally conductive particles 196 may have a particle size of up to about 25 µm. The thermally conductive particles 196, particularly when utilized in concert with the patterned surface 198, significantly increases the heat transfer efficiency between the heat spreader 102 and IC dies 106.

The heat spreader 102 may be structurally coupled to the package substrate 108 or PCB 116 to increase the rigidity of the chip package assembly 100. Optionally, the heat spreader 102 may be dynamically mounted to the PCB 116 in a manner that allows relative movement between the heat spreader 102 to the underlying chip package assembly 100. Allowing relative movement reduces stress within the chip package assembly 100, which in turn increases the reliability and effectiveness of the solder connections 118.

In the example depicted in FIG. 1, the bottom surface 144 of the heat spreader 102 includes a threaded boss 154. The threaded boss 154 accepts a fastener 156 that extends through a through hole 158 formed in the PCB 116. A spring 160 is disposed between a head of the fastener 156 and a bottom surface 128 of the PCB 116. The spring 160 applies a force on the fastener 156 that is aligned in an axial direction of the fastener 156, which in turn causes the heat spreader 102 to be pulled toward the PCB 116. The force on the heat spreader 102 also causes the heat spreader 102 to be urged against the IC dies 106 of the chip package assembly 100, which is sandwiched between the heat spreader 102 and an upper surface 103 of the PCB 116. The bottom surface 144 of the heat spreader 102 may also include a pad 152 projecting from the bottom surface 144 that makes contact with the IC dies 106 through the TIM 114. Although shown as being planar, the pad 152 may include steps so that different portions of the pad 152 extend different distances from the bottom surface 144 of the heat spreader 102, thus allowing different heights of the IC dies 106 to be accommodated while maintaining good thermal contact with the heat spreader 102.

The cooling plate assembly 180 is mounted above a top surface 146 of the heat spreader 102. The cooling plate assembly 180 is in good thermal contact directly with or through TIM 114 with the top surface 146 of the heat spreader 102. The cooling plate assembly 180 provides an efficient heat transfer path away from one or more chip package assemblies 100, thus providing robust thermal management of the IC dies 106 within the electronic device 150.

The cooling plate assembly 180 generally includes a cooling plate 182, one or more optional topside passive cooling devices 176, one or more topside active cooling devices 184 and one or more bottomside passive cooling devices 186. The cooling plate 182 separates the topside passive and active cooling devices 176, 184 from the one or more bottomside passive cooling devices 186. Optionally, the topside active cooling devices 184 may be utilized with or without either or both of the passive cooling devices 176, 186.

The cooling plate 182 has a top surface 164 and a bottom surface 162. The cooling plate 182 is fabricated from rigid thermally conductive material. Materials suitable for fabricating the cooling plate 182 include stainless steel, copper, nickel-plated copper and aluminum, among other suitable thermally conductive materials. In the example depicted in FIG. 1, the cooling plate 182 is fabricated from aluminum. Although the lateral planar area of the cooling plate 182 is not illustrated in FIG. 1, the planar area of the cooling plate 182 is larger, for example as much as 2, 4 or even 10 times or more larger than the planar area of the chip package assembly 100. For example as illustrated in FIG. 1, a width 148 of the chip package assembly 100 in an X direction is much less than and is completely overhung by the width of the cooling plate 182 in the same direction. The relative widths of the chip package assembly 100 and the cooling plate 182 in a Y direction has a similar relationship. As a result, the area and mass of the cooling plate 182 is much, much greater than that of the chip package assembly 100 and IC dies 106 disposed therein.

As mentioned above, the topside passive and active cooling devices 176, 184 are mounted in or on the top surface 164 of the cooling plate 182. For example, the one or more topside passive devices 176 may be soldered, adhered, brazed, clamped, fastened or otherwise affixed in good thermal contact with the top surface 164 of the cooling plate 182. In one example, the one or more topside passive devices 176 is affixed by a thermally conductive material 174 to the top surface 164 of the cooling plate 182. The thermally conductive material 174 may be solder, TIM or other suitable thermally conductive material.

The topside passive device 176 generally is an object having a higher thermal conductivity than the cooling plate 182, and does not contain ports for working fluids such as coolant to be circulated therethrough. In one example, the topside passive device 176 is a heat pipe. In another example, the topside passive device 176 is a thermoelectric cooling device, such as a Peltier cooler.

The one or more bottomside passive cooling devices 186 are mounted on or in the bottom surface 162 of the cooling plate 182. Similar to the topside passive device 176, the bottomside passive cooling device 186 generally is an object having a higher thermal conductivity than the cooling plate 182, and does not contain ports for working fluids such as coolant to be circulated therethrough. In one example, the bottomside passive cooling device 186 is a heat pipe, a thermoelectric cooling device, or other suitable cooling device. In the example depicted in FIG. 1, the bottomside passive cooling devices 186 are disposed in channels 188 formed in the bottom surface 162 of the cooling plate 182. The space between the bottomside passive cooling device 186 and the bottom and/or sides of the channel 188 may be filled with a thermally conductive material 178, such as solder, TIM or other suitable thermally conductive material.

The one or more topside active cooling devices 184 are mounted in or on the top surface 164 of the cooling plate 182. For example, the one or more topside active cooling devices 184 may be soldered, adhered, brazed, clamped, fastened or otherwise affixed in good thermal contact with the top surface 164 of the cooling plate 182. In one example, the one or more active cooling devices 184 is affixed by solder to the top surface 164 of the cooling plate 182.

The topside passive device 176 generally contain ports for circulating working fluids, such as coolant, through the passive device 176. Thus, the passive cooling devices 176, 186 generally route heat to different portions of the cooling plate 182, while the active cooling devices 184 remove heat from the cooling plate 182. Accordingly, the cooling plate assembly 180 effectively removes heat from the chip package assemblies 100 utilizing predetermined placement of the cooling devices 176, 184, 186 relative to location of the heat sources (i.e., IC dies 106) within the chip package assemblies 100 and the electronic device 150.

FIG. 2 is a schematic top view of an electronic device, such as the electronic device 150 if FIG. 1, having a cooling plate assembly interfaced with a plurality of chip package assemblies illustrating an exemplary geometric arrangement of active and passive cooling devices disposed on a top surface of the cooling plate assembly. The relative number and locations of the chip package assemblies 100 and size of the cooling plate assembly 180 to the PCB 116 are for illustrative purposes only, and are not intended to be limiting in number or scale.

In the example of FIG. 2, two chip package assemblies 100 are shown in phantom disposed under the cooling plate 182 of the cooling plate assembly 180. A respective one of the active cooling devices 184 is shown directly over a corresponding one of the chip package assemblies 100. Although the number of active cooling devices 184 to chip package assemblies 100 are shown in FIG. 2 as having a one-to-one correspondence, the ratio of active cooling devices 184 to chip package assemblies 100 may be less than or greater than one-to-one.

As illustrated in FIG. 2, the area of the cooling plate 182 in the X-Z plane is much greater than the area of the chip package assemblies 100. Additionally, the cooling plate 182 has no through penetrations (i.e., holes passing through both surfaces 162, 164) in the region of the cooling plate 180 disposed over the chip package assemblies 100 or under the active cooling devices 184, thus allowing the cooling plate 182 to function as a physical fluid barrier between the active cooling devices 184. Advantageously, the physical fluid barrier provided by the cooling plate 160 protects the sensitive electronic circuitry of the IC dies 106 and chip package assemblies 100 disposed on the other side of the cooling plate 182.

Each of the active cooling devices 184 is coupled by a conduit 204 to an inlet manifold 202. The inlet manifold 202 is coupled to a source of working fluid (not shown) by at least one supply line 206. In one example and as further discussed below with reference to FIG. 5, the inlet manifold 202 is configured to remove particles from the working fluid so that the efficiency and longevity of the active cooling devices 184 is maintained. Optionally, more than one inlet manifold 202 may be utilized to supply the active cooling devices 184.

In one example, the supply line 206 is coupled at a first end of the inlet manifold 202, while the conduits 204 are coupled closer to the second end of the inlet manifold 202, thus causing the working fluid within the inlet manifold 202 for flow from the first end to the second end. The flow of working fluid from the first end to the second end within the inlet manifold 202 increases the residence time of the working fluid within the manifold 202, thus allowing for a greater number of particles to settle out of the working fluid prior to exiting the manifold 202 through the conduits 204.

In the example depicted in FIG. 2, each of the active cooling devices 184 is coupled by a conduit 210 to an outlet manifold 208. The outlet manifold 208 may optionally be coupled by an exhaust line 212 to the source of working fluid so that the working fluid may be recycled through the active cooling devices 184. Alternatively, outlet manifold 208 may be coupled by the exhaust line 212 to a collection reservoir (not shown) where the working fluid is accumulated for disposal or recycling.

The topside passive cooling devices 176 generally have an orientation that is parallel relative to the top surface 164 of the cooling plate 182. For example, both the topside passive cooling devices 176 and the cooling plate 182 reside in the X-Z plane. The passive cooling devices 176 are generally positioned to move heat from one portion of the cooling plate 182 to a portion of the cooling plate 182 closer to one of the active cooling devices 184. One or more of the topside passive cooling devices 176 may be a linear orientation, or have another orientation, such as U-shaped, L-shaped, J-shaped, "hockey stick-shaped" or other suitable shape.

The passive cooling device 176 may be elongated such that the passive cooling device 176 includes a first end 222 and a second end 224. The first end 222 is disposed proximate one of the active cooling devices 184, while the second end 224 is disposed further away from the active cooling device 184. In the example depicted in FIG. 2, the first end 222 of the passive cooling device 176 has an orientation substantially parallel with the adjacent side of the active cooling device 184, making an obtuse included angle with the first end 222. Alternatively, the ends 222, 224 have another orientation. Additionally, the first end 222 of the passive cooling device 176 may disposed closer to one of the inlet and outlet manifolds 202, 208, while the second end 224 of the passive cooling device 176 is disposed closer to the other of the inlet and outlet manifolds 202, 208. In examples where two or more passive cooling devices 176 are utilized, the first end 222 of the first passive cooling device 176 is disposed closer to the inlet manifold 202, the first end 222 of the second passive cooling device 176 is disposed closer to the outlet manifold 208, while the second end 224 of the passive cooling device 176 is disposed closer to the outlet manifold 208, and the second end 224 of the second passive cooling device 176 is disposed closer to the inlet manifold 202.

In the example of FIG. 2, two passive cooling device 176 are shown with first ends 222 adjacent opposite sides of the same active cooling device 184. However, any respective number of passive cooling devices 176 may be interfaced with a single one of the active cooling devices 184, as limited by spatial constraints.

Additionally as shown in FIG. 2, two active cooling devices 184 are shown disposed on the same side of a single cooling plate 182. However, any respective number of active cooling devices 184 may be interfaced with a single cooling plate 182, as limited by spatial constraints. Moreover, the ratio of active cooling devices 184 to chip package assemblies 100 interfaced on opposite sides of the same cooling plate may have a one-to-one correspondence, or alternatively, the ratio of active cooling devices 184 to chip package assemblies 100 may be less than or greater than one-to-one.

Also as illustrated in FIG. 2, there are no penetrations, i.e., holes, passing through (i.e., connecting) both the first and second surfaces 162, 164 of the cooling plate 182 at least within the areal extent 256 of the outer boundaries of the active cooling devices 184. That is, each side the outer boundaries of the active cooling devices 184 as a group is defined by the side of the active cooling device 184 closest to the nearest edge of the cooling plate 180. Since there are no penetrations within the areal extent 256, the cooling plate 182 provides a solid physical barrier that prevents fluid potentially present on the top surface 164 of the cooling plate 182 from being exposed to the chip package assemblies 100 disposed below the bottom surface 162 of the cooling plate 182. In other embodiments, there are no penetrations of the cooling plate 182 at least within the areal extent 254 of the outer boundaries of the chip package assemblies 100. That is, each side the outer boundaries of the chip package assemblies 100 as a group is defined by the side of the chip package assembly 100 closest to the nearest edge of the cooling plate 180. In still other embodiments, there are no penetrations of the cooling plate 182 at least within the areal extent 252 of the outer boundaries of the cooling fluid circuit defined by the inlet manifold 202, the outlet manifold 208 and the active cooling device 184 (i.e., cooling fluid circuit components). That is, each side the outer boundaries of the cooling fluid circuit components as a group is defined by the side of the cooling fluid circuit component closest to the nearest edge of the cooling plate 180. In yet other embodiments, the entire cooling plate 180 has no penetrations connecting the first and second surfaces 162, 164 of the cooling plate 182.

FIG. 3 is a schematic bottom view of the cooling plate assembly 180 of FIG. 2 illustrating an exemplary geometric arrangement of bottomside passive cooling devices 186 disposed on the bottom surface 162 of the cooling plate assembly 180. In the example of FIG. 3, two active passive cooling devices 184 are shown in phantom disposed on the opposite side of the cooling plate 182.

The bottomside passive cooling devices 186 have an orientation that is generally parallel with the bottom surface 162 of the cooling plate 182. For example, both the bottomside passive cooling devices 186 and the bottom surface 162 of the cooling plate 182 reside in the X-Z plane. In one example, the passive cooling devices 186 are generally positioned to move heat from one portion of the cooling plate 182 to a portion of the cooling plate 182 closer to one of the active cooling devices 184. In another example, the passive cooling devices 186 are generally positioned to move heat from one portion of the cooling plate 182 to a portion of the cooling plate 182 farther from the IC dies 106 of the chip package assemblies 1000. One or more of the bottomside passive cooling devices 186 may be a linear orientation, or have another orientation, such as U-shape, L-shape, J-shape, "hockey stick-shape" or other suitable shape. In the example depicted in FIG. 3, the bottomside passive cooling devices 186 are U-shaped.

The bottomside passive cooling devices 186 may be elongated such that the passive cooling device 186 includes a first end 232 and a second end 234. The first end 232 is disposed proximate (i.e., below) one of the active cooling devices 184, while the second end 234 is disposed further away from the active cooling device 184. In the example depicted in FIG. 3, the first end 232 of the passive cooling device 186 has an orientation substantially parallel with the adjacent side of the active cooling device 184, but may alternatively have another orientation.

In the example of FIG. 3, at least two passive cooling devices 186 are shown with first ends 232 interfacing with (i.e., positioned adjacent or below) the same active cooling device 184. However, any respective number of passive cooling devices 186 may be interfaced with a single one of the active cooling devices 184, as limited by spatial constraints.

Additionally as shown in FIG. 2, seven bottomside passive cooling devices 186 are shown disposed on the same side of a single cooling plate 182. However, any respective number of passive cooling devices 186 may be interfaced with a single cooling plate 182, as limited by spatial constraints. The passive cooling devices 186 may optionally interleave with each other. Additionally, opposite ends of one passive cooling device 186 may each optionally interleave with the immediately adjacent passive cooling devices 186.

Moreover, the ratio of passive cooling devices 186 to active cooling devices 184 or chip package assemblies 100 may have a one-to-one correspondence, or alternatively may have a ratio of active cooling passive cooling devices 186 to active cooling devices 184 or ratio of active cooling passive cooling devices 186 to chip package assemblies 100 may be less than or greater than one-to-one.

FIG. 4 is a sectional view of one example of a topside passive cooling device 176 that is part of the cooling plate assembly 180 of FIG. 2. The bottomside passive cooling device 186 is similarly constructed, although the topside and bottomside passive cooling devices 176, 186 may have differing shape or geometry.

The topside passive cooling device 176 is illustrated in FIG. 4 as a heat pipe. As noted above, the passive cooling device 176 may be a thermoelectric cooling device, such as a Peltier cooler, or other suitable cooling device. When in the form of a heat pipe, the topside passive cooling device 176 includes a sealed tube 422 having a first end 424 and a second end 426. The first and second ends 424, 426 of the sealed tube 422 correspond to the first and second ends 222, 224 of the topside passive cooling device 176. The tube 422 includes a sealed cavity 428 in which a phase change material 430 is disposed. In operation, the phase change material 430 in a liquid phase in contact with a thermally conductive solid surface, i.e., the first end 424 of the tube 422, turns into a vapor by absorbing heat transferred from one of the dies 106. For example, the first end 424 of the tube 422 may receive heat transferred from the dies 106. The vapor (e.g., the phase change material 430) then travels between the first end 424 of the tube 422 inside the cavity 428 to the cold interface, i.e., the second end 426 of the tube 422, and condenses back into a liquid—releasing the latent heat into the cooling plate 182, as shown in FIG. 1, where the latent heat is eventually removed from the cooling plate 182 by the active cooling devices 184. The phase change material 430 in liquid form then returns to the hot interface at the first end 424 of the tube 422 through capillary action and/or gravity, and the cycle repeats. Due to the very high heat transfer coefficients for boiling and condensation, the passive cooling device 176 in the form of a heat pipe is highly effective for conducting heat away from the dies 106 to locations of the cooling plate 182 from which the heat may be more quickly and effectively removed from the electronic device 150, which advantageously improves the heat transfer performance of the IC dies 106 and chip package assemblies 100 of the electronic device 150.

Figure 5:
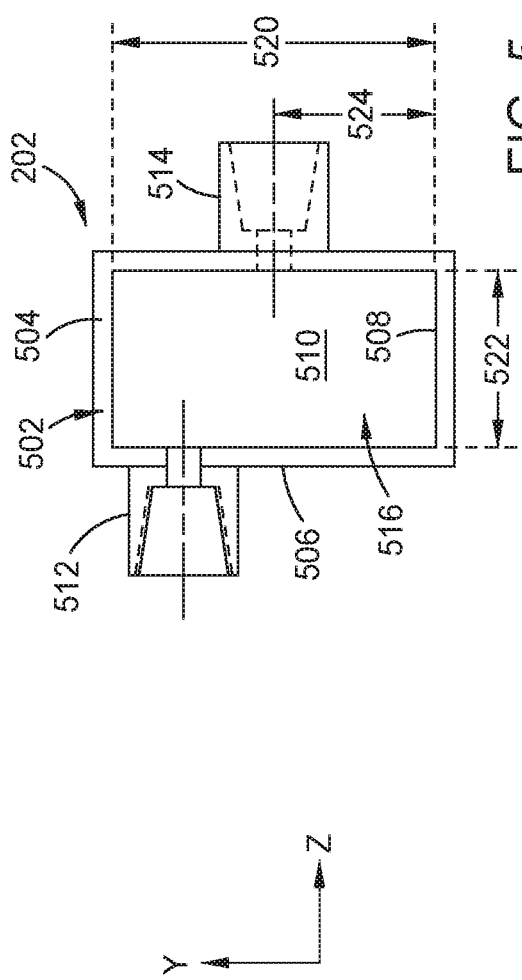
FIG. 5 is a sectional view of one example of an inlet manifold configured to remove particles from working fluids (i.e., coolant) provided to the active cooling devices of the cooling plate assembly of FIG. 2.

FIG. 5 is a sectional view of one example of the inlet manifold 202. As stated above, the inlet manifold 202 is configured to remove particles from working fluids (i.e., coolant) provided to the active cooling devices 184 of the cooling plate assembly 180. The inlet manifold 202 is generally a hollow tube 502 enclosing an interior volume 510. Although the tube 502 is illustrated as having a rectangle profile in FIG. 5, other profiles including circular, oval, polygonal or other suitable shape may be utilized. The tube 502 is generally fabricated from a material that is compatible with the working fluid and does not generate particles when exposed to the working fluid. In one example, the tube 502 is fabricated from copper or high-density polyethylene (HDPE), among others.

In the example depicted in FIG. 5, the tube 502 includes a top 504, sides 506, and a bottom 508 that enclose the interior volume 510. The bottom 508 has an interior width 522, while the sides have an interior height 520. The height 520 is generally oriented in the Y direction while width 522 is generally oriented in the X-Z plane. The interior volume 510 is generally configured to promote settling of particles out of the working fluid flowing through the inlet manifold 202, and having a height to width aspect ratio greater than 1 to 1 assists promoting settling. In one example, the aspect ratio of the tube 502 is at least 2 to 1.

The inlet manifold 202 also includes at least one inlet port 512 and at least one outlet port 514. The inlet port 512 allows coupling of the supply line 206 (shown in FIG. 2) to the inlet manifold 202 so that working fluid provided through the supply line 206 may be supplied to the interior volume 510 through the inlet port 512. The inlet port 512 may be threaded or otherwise configured to accept a connector fitting suitable for coupling the supply line 206 to the inlet manifold 202.

The outlet port 514 allows coupling of the conduit 204 also shown in FIG. 2) to the active cooling device 184 so that working fluid provided through the conduit 204 may be supplied to the active cooling device 184 through the outlet port 514. The outlet port 514 may be threaded or otherwise configured to accept a connector fitting suitable for coupling the conduit 204 to the active cooling device 184. Generally, there is at least one outlet port 514 for each active cooling device 184.

The outlet port 514 is generally formed through the tube 502 at an elevation 524 from the bottom 508 as measured in the Y direction. The greater the elevation 524 is relative to the height 520, the larger a space 516 defined in the interior volume 510 will be, thus, increasing the effectiveness of the inlet manifold 202 for removing particles from the working fluid within the interior volume 510. This is because the velocity of the working fluid flowing in the space 516 is generally lower than the velocity of the working fluid flowing in the region of the interior volume 510 at or above the location of the outlet port 514. In one example, the elevation 524 of the outlet port 514 is at least half the height 520. As noted above, removal of particles from the working fluid greatly increases the effectiveness and service life of the active cooling devices 186 coupled to the inlet manifold 202.

Figure 6:
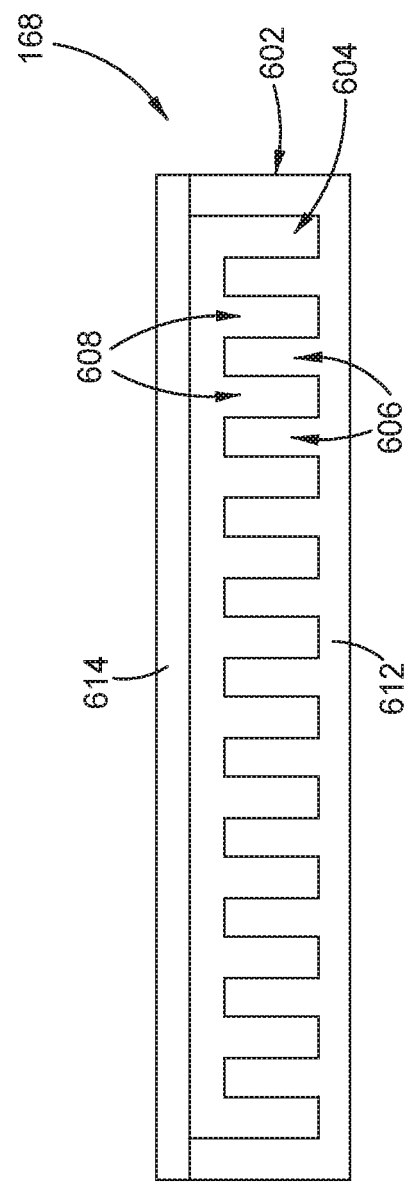
FIG. 6 is a sectional view of one example of an active cooling device that is part of the cooling plate assembly of FIG. 2.

FIG. 6 is a sectional view of one example of the active cooling device 186 that is part of the cooling plate assembly 100 of FIG. 2. The active cooling device 186 generally includes body 602 having a hollow interior 604 into which a plurality of fins 606 extend. The fins 606 create channels 608 within the hollow interior 604 through which the working fluid is flowed.

In one example, the body 602 includes a base 612 and a cap 614. The cap 614 is coupled to the base 612 to sealingly enclose the hollow interior 604. The cap 614 may be sealingly coupled to the base 612 by brazing or other suitable technique. The base 612 and the cap 614 are generally fabricated from a highly thermally conductive material that is compatible with the working fluids. In one example, the base 612 and the cap 614 are generally fabricated from copper. Aluminum generally is not suitable for use the body 602 as aluminum generally oxides and/or corrodes in a manner when exposed to the working fluid that generates particulates that could clog the channels 608 defined between the fins 606, thus reducing the heat transfer efficiency of the active cooling device 186.

The fins 606 extend from one or both of the base 612 and the cap 614. In the example depicted in FIG. 6, the fins 606 are formed from the base 612 and extend into the hollow interior 604 to define a plurality of channels 608. The fins 606 may be formed by a skiving process or other suitable technique to produce micro-sized channels 608 that increase the surface area of the body 602 available for heat transfer with the working fluid, which enhances the performance of the active cooling device 186. Moreover, as discussed above, as the inlet manifold 202 is configured to remove particles from the working fluid, the micro-sized channels 608 are much less prone to clogging, which significantly extends the service life and performance of the active cooling device 186.

Figure 7:
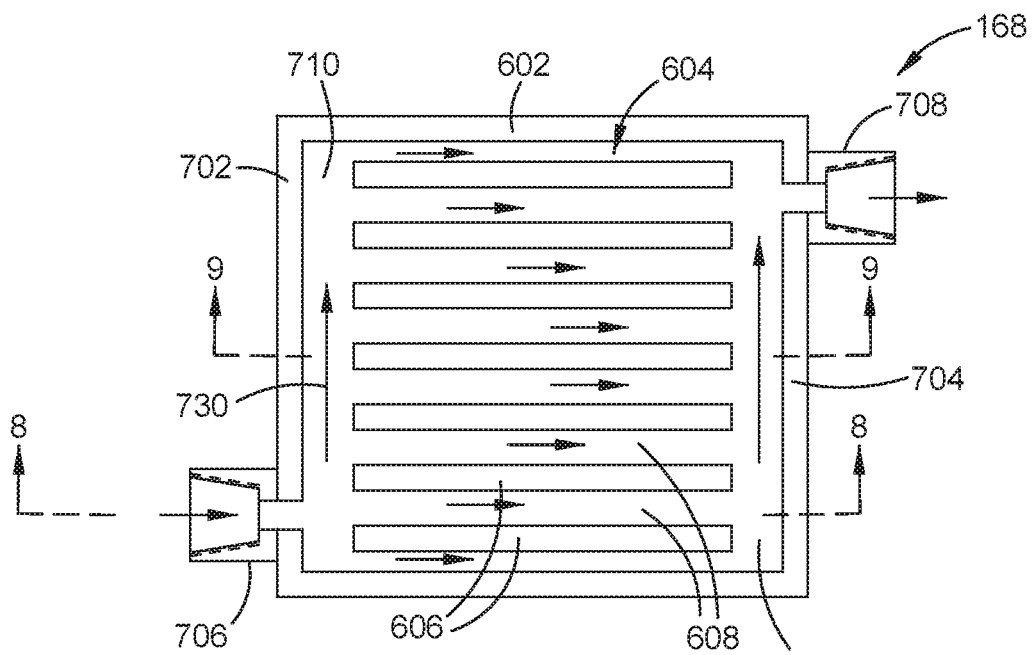
FIG. 7 is another sectional view of the active cooling device of FIG. 6.
Figure 8:
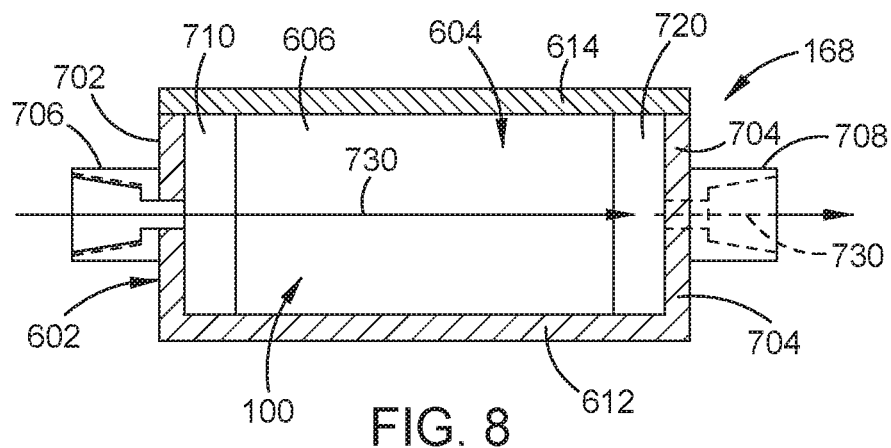
FIG. 8 is a sectional view of the active cooling device taken along section line 8-8 of FIG. 7.
Figure 9:
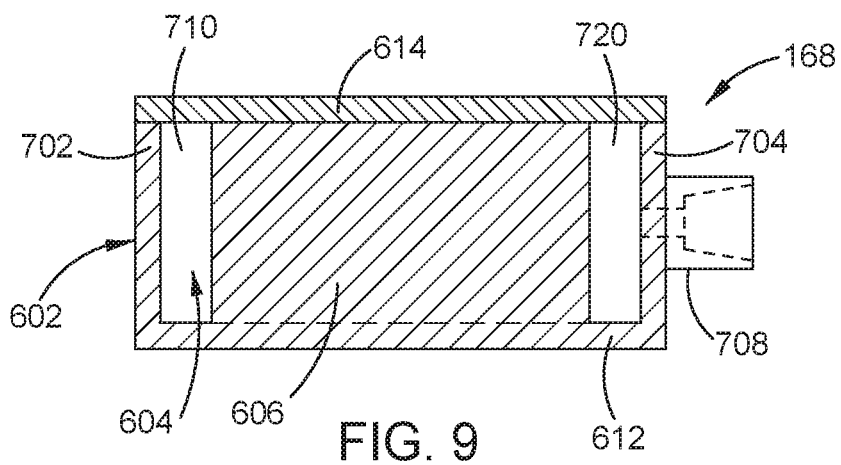
FIG. 9 is a sectional view of the active cooling device taken along section line 9-9 of FIG. 7.

FIG. 7 is another sectional view of the active cooling device 186 depicted in FIG. 6. FIGS. 8 and 9 are additional sectional views of the active cooling device 186 taken through section line 8-8 and section line 9-9 illustrated in FIG. 7. Referring to FIGS. 7-9, the body 602 of the active cooling device 186 includes first and second sidewalls 702, 704 disposed on opposite sides of the body 602. An inlet port 706 is disposed through the first sidewall 702 and is configured to couple to the conduit 204, thus fluidly coupling the interior volume 510 of the inlet manifold 202 to the hollow interior 604 of the body 602 of the active cooling device 186. An outlet port 708 is disposed through the second sidewall 704 and is configured to couple to the conduit 210, thus allowing the spent working fluid to exit the hollow interior 604 of the body 602 of the active cooling device 186 after heat transfer with the fins 606.

The hollow interior 604 of the body 602 includes an inlet plenum 710 and an outlet plenum 720. The inlet plenum 710 is disposed adjacent the inlet port 706, while the outlet plenum 720 is disposed adjacent the outlet port 708. The inlet plenum 710 is fluidly connect to the outlet plenum 720 via the channels 608. As illustrated by flow arrows 730, the inlet plenum 710 receives the working fluid entering the hollow interior 604 through the inlet port 706, the working fluid then flows through the channels 608 to the outlet plenum 720, and finally, the working fluid entering the outlet plenum 720 from the channels 608 exits the outlet plenum 720 through the outlet port 708.

FIGS. 10-11 are schematic flow diagrams of various alternative examples of fluid circuits that may be utilized with the active cooling device of the cooling plate assembly of FIG. 1, among others. Referring first to FIG. 10, a schematic flow circuit diagram 1000 is depicted illustrating the flow of working fluid (i.e., coolant) through an exemplary cooling plate assembly 180. The bounds of the cooling plate 182, and thus the cooling plate 182, is shown in phantom. The working fluid is provided to the cooling plate assembly 180 from a fluid source 1002 that is remotely located from the cooling plate assembly 180 and the electronic device 150. The fluid source 1002 is coupled to the inlet manifold 202 coupled to the cooling plate 182 by the supply line 206. The inlet manifold 202 distributes the working fluid to the active cooling devices 186 coupled to the cooling plate 182 via conduits 204. Although two active cooling devices 186 are illustrated coupled to the cooling plate 182 in FIG. 10, any number of cooling devices 186 may be coupled to the inlet manifold 202 as space permits. The outlet manifold 208 coupled to the cooling plate 182 collects the working fluid exiting the active cooling devices 186 via conduits 210. The working fluid is then removed from the outlet manifold 208 via the exhaust line 212 to a location remove from the cooling plate assembly 180 and the electronic device 150 where the spent working fluid may be recycled, disposed of or otherwise handled.

FIG. 11 depicts another schematic flow circuit diagram 1100 illustrating a recycled flow of working fluid (i.e., coolant) through an exemplary cooling plate assembly 180. The bounds of the cooling plate assembly 180, and thus the cooling plate 182, is shown in phantom. The working fluid is provided to the inlet manifold 202 of cooling plate assembly 180 from a fluid source 1102 that is located on the cooling plate assembly 180 within the electronic device 150. The fluid source 1002 may be pump for moving the working fluid to the inlet manifold 202 coupled to the cooling plate 182 by the supply line 206. As discussed above with reference to FIG. 10, the inlet manifold 202 distributes the working fluid to the active cooling devices 186, and the working fluid exiting the active cooling devices 186 are collected in the outlet manifold 208. The exhaust line 212 moves the working fluid leaving the outlet manifold 208 to a heat exchanger 1104. The working fluid leaving the heat exchanger 1104 is returned to the fluid source 1002. The heat exchanger 1104 cools the spent working fluid prior to being recycled back through the active cooling devices 186 from the fluid source 1002. The heat exchanger 1104 may be a heat sink or other suitable heat transfer device.

Figure 12:
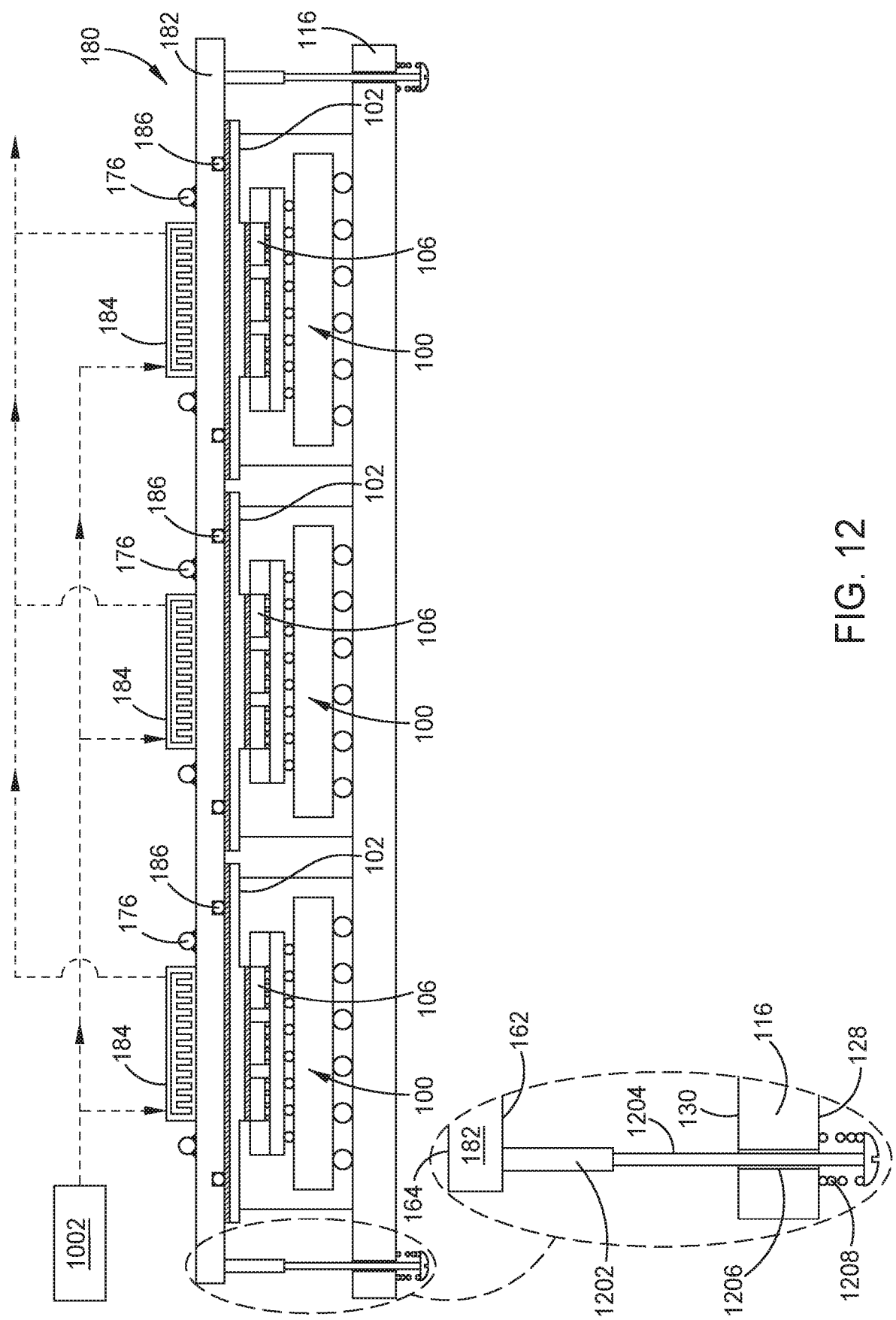
FIG. 12 is a schematic view of an electronic device having a plurality of chip package assemblies interfaced with a cooling plate assembly.

FIG. 12 is a schematic view of an electronic device 150 having a plurality of chip package assemblies 100 interfaced with a cooling plate assembly 180. The electronic device 150 may be the electronic device 150 partially shown in FIG. 1, or an electronic device of another configuration.

The electronic device 150 illustrated in FIG. 12 has three chip package assemblies 100 with heat spreaders 102 sandwiched between a single cooling plate 182 of the cooling plate assembly 180 and at least one PCB 116. It is contemplated that the number of chip package assemblies 100 may be any number greater than 1.

The cooling plate 182 may be rigidly coupled to the PCB 116. Optionally and as shown in FIG. 12, the cooling plate 182 is dynamically mounted to the PCB 116 in a manner that allows relative movement between the cooling plate 182 and the heat spreaders 102 overlying each chip package assembly 100. Allowing relative movement reduces stress within the chip package assembly 100 and PCB 116, which in turn increases the reliability and effectiveness of the solder balls 120, while enhancing heat transfer efficiency away from the IC dies 106 of the chip package assemblies 100. In the example depicted in FIG. 1, the bottom surface 162 of the cooling plate 182 includes a threaded boss 1202. The threaded boss 1202 accepts a fastener 1204 that extends through a through hole 1206 formed in the PCB 116. A spring 1208 is disposed between a head of the fastener 1204 and a bottom surface 128 of the PCB 116. The spring 1208 applies a force on the fastener 1204 which is aligned in an axial direction of the fastener 1204, which causes the cooling plate 182 to be pulled toward the PCB 116. The force on the cooling plate 182 also causes the cooling plate 182 to be urged against to top surface 146 of the heat spreader 102, thus maintaining good thermal contact between the cooling plate 182 and the heat spreader 102, thereby providing robust temperature management of the electronic device 150.

Notably illustrated in FIG. 12 is that the cooling plate 180 extends in the X-Z plane over an area that is larger than the combined area of all the chip package assemblies 100 disposed below the cooling plate 180. In one example, the area of the cooling plate 180 is at least twice as large as the combined area of all the chip package assemblies 100 disposed below the cooling plate 180. Additionally, the cooling plate 180 has no penetrations (i.e., holes connecting both surfaces 162, 164) over any of the chip package assemblies 100 disposed below the cooling plate 180, nor within the area the area bounded by the lateral extents of the chip package assemblies 100 in the X-Z plane, thus providing a solid physical fluid tight barrier between the active cooling devices 184 and the IC dies 106, which substantially prevents the potential catastrophic shorting of the electrical circuitry of the chip package assemblies 100 below the cooling plate 100.

Thus, cooling plate assembly and electronic device having the same are disclosed herein which utilizes active and passive cooling devices for improved thermal management of the electronic device. Active and passive cooling devices are integrated with a cooling plate to provide robust heat transfer for cooling IC dies of the electronic device, while having a configuration that shields the sensitive electronics of the chip package assemblies from coolant if inadvertently leaked. As the cooling plate provides a barrier between the active cooling devices and the chip packages of the electronic device, the cooling plate provide robust protection of the electronic circuitry of the chip package assemblies from catastrophic failure in the event of coolant leaks. Moreover, the large thermal mass of the cooling plate assembly provides robust an extremely efficient heat sink which efficiently removes away from hot regions over the chip packages to regions of the cooling plate assembly that are better suited to effectively transfer heat away from the chip package assemblies. Advantageously, the enhanced heat transfer out of the chip package assembly improves reliability and performance, while risk of catastrophic failure due to coolant leakage is substantially eliminated.

While the foregoing is directed to embodiments of the present invention, other and further embodiments of the invention may be devised without departing from the basic scope thereof, and the scope thereof is determined by the claims that follow.

What is claimed is:

1. A cooling plate assembly comprising:
   a cooling plate having a first surface and an opposing second surface;
   a first active cooling device mounted on and in contact with the first surface of the cooling plate; and
   a first passive cooling device coupled to the second surface of the cooling plate, wherein the cooling plate has no perforations in a region of the cooling plate overlapped by the first active cooling device.

2. The cooling plate assembly of claim 1, wherein the first active cooling device further comprises:
   a copper body having a hollow interior, the copper body mounted on the first surface of the cooling plate;
   an inlet port and an outlet port formed through the copper body and
   a plurality of fins extending into hollow interior to define a plurality of channels therebetween.

3. The cooling plate assembly of claim 2 further comprising:
   a second active cooling device mounted on the first surface of the cooling plate.

4. The cooling plate assembly of claim 3 further comprising:
   an inlet manifold having a first outlet port coupled to the first active cooling device and a second outlet port coupled to the second active cooling device.

5. The cooling plate assembly of claim 4, wherein the inlet manifold has an aspect ratio greater than two.

6. The cooling plate assembly of claim 1 further comprising:
   a second passive cooling device coupled to the second surface of the cooling plate, the second passive cooling device having a first end disposed adjacent the first active cooling device and a second end disposed laterally away from the first active cooling device.

7. The cooling plate assembly of claim 1, wherein the first active cooling device is one of a plurality of active cooling devices mounted on the first surface of the cooling plate.

8. The cooling plate assembly of claim 7, wherein the first passive cooling device is one of a plurality of passive cooling devices coupled to the first surface of the cooling plate.

9. The cooling plate assembly of claim 8 further comprising:
   a plurality of second passive cooling devices coupled to the first surface of the cooling plate.

10. The cooling plate assembly of claim 9, wherein a first end of two of the plurality of second passive cooling devices are disposed directly below the first active cooling device.

11. An electronic device comprising:
    a printed circuit board (PCB);
    a first chip package assembly mounted to the PCB;
    a cooling plate sandwiching the first chip package assembly against the PCB, the cooling plate having a first surface facing away from the PCB and a second surface facing the PCB;
    a first active cooling device mounted on and in contact with the first surface of the cooling plate; and
    a first passive cooling device coupled to the second surface of the cooling plate, wherein the cooling plate has no perforations in a region of the cooling plate overlapped by the first active cooling device.

12. The electronic device of claim 11 further comprising:
    a second chip package assembly sandwiched between the PCB and the cooling plate; and
    a third chip package assembly sandwiched between the PCB and the cooling plate.

13. The electronic device of claim 12 further comprising:
    a second active cooling device coupled to the first surface of the cooling plate and aligned with the second chip package assembly; and
    a third active cooling device coupled to the first surface of the cooling plate and aligned with the third chip package assembly.

14. The electronic device of claim 11 further comprising:
    a second active cooling device coupled to the first surface of the cooling plate; and
    an inlet manifold having a first outlet port coupled to the first active cooling device and a second outlet port coupled to the second active cooling device, the inlet manifold having an aspect ratio greater than two.

15. The electronic device of claim 11, wherein the first active cooling device is one of a plurality of active cooling devices coupled to the first surface of the cooling plate; and
    wherein the first passive cooling device is one of a plurality of passive cooling devices coupled to the first surface of the cooling plate.

16. The electronic device of claim 11 further comprising:
    a plurality of second passive cooling devices coupled to the first surface of the cooling plate.

17. The electronic device of claim 11, wherein the cooling plate is coupled to the PCB in a manner that permits relative movement between the PCB and the cooling plate.

18. The electronic device of claim 11 further comprising:
    a heat spreader disposed between the cooling plate and the first chip package assembly, the heat spreader having a patterned surface facing the first chip package assembly; and
    a thermal interface material (TIM) having thermally conductive particles dispersed in a carrier, the TIM contacting the patterned surface and at least one IC die of the first chip package assembly.

19. The cooling plate assembly of claim 1, wherein a first active cooling device is an active liquid cooling device.

20. The electronic device of claim 11, wherein a first active cooling device is an active liquid cooling device.

* * * * *